United States Patent [19]

Okabe

[11] 3,955,107

[45] May 4, 1976

[54] PHASE SWITCHING DEVICE

[75] Inventor: Masayoshi Okabe, Tokyo, Japan

[73] Assignee: Sony Corporation, Tokyo, Japan

[22] Filed: Apr. 25, 1975

[21] Appl. No.: 571,689

[30] Foreign Application Priority Data

May 10, 1974 Japan................................ 49-52111

[52] U.S. Cl................................ 307/295; 307/304; 328/155; 358/18; 307/251
[51] Int. Cl.²..................... H03K 17/00; H04N 5/04
[58] Field of Search ........... 307/295, 249, 304, 286, 307/251, 322, 232; 328/155; 358/17, 18, 19, 20, 24

[56] References Cited
UNITED STATES PATENTS

| | | | |
|---|---|---|---|
| 2,994,044 | 7/1961 | Straube............................ | 307/295 X |
| 3,327,133 | 6/1967 | Sickles............................... | 307/251 |
| 3,348,145 | 10/1967 | Erath............................... | 307/232 X |
| 3,534,156 | 10/1970 | Henze................................. | 358/18 |
| 3,794,754 | 2/1974 | Haferl.................................. | 358/18 |

*Primary Examiner*—John S. Heyman
*Attorney, Agent, or Firm*—Hill, Gross, Simpson, Van Santen, Steadman, Chiara & Simpson

[57] ABSTRACT

A phase switching device using a novel four terminal semiconductor device having a generally V-shaped emitter grounded current amplification characteristic or factor. The device is biased to a low point on the characteristic curve and a rectangular switching signal is added to the bias to cause the operating point on the curve to shift about the low point. An input signal is then superimposed on the resulting rectangular switching signal, the input signal having a higher frequency than the switching signal and being phase shifted each time the switching signal reverses polarity.

6 Claims, 8 Drawing Figures

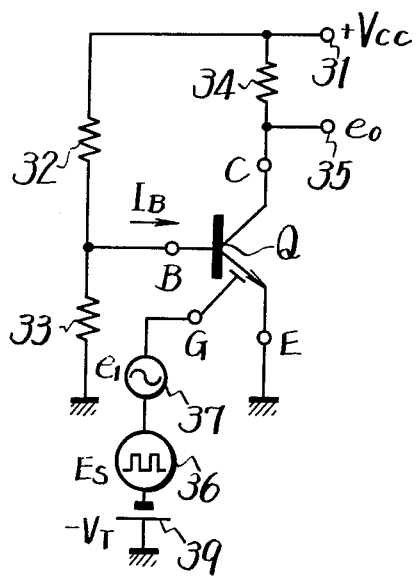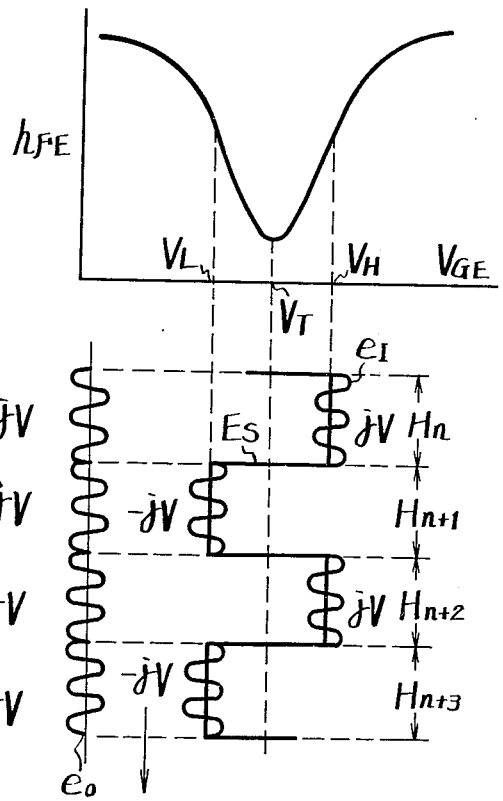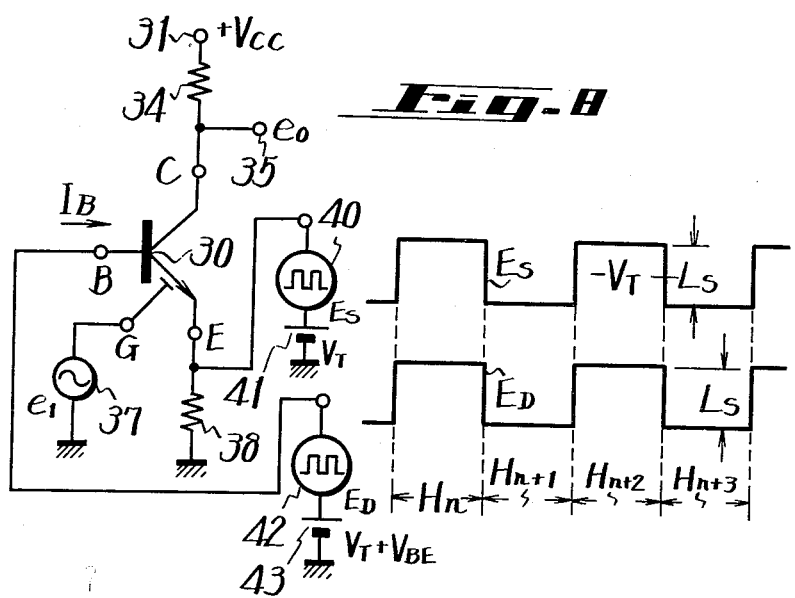

3,955,107

PHASE SWITCHING DEVICE

BACKGROUND OF THE INVENTION

Field of the Invention

The field of art to which this invention pertains is phase switching circuits and in particular to circuits for automatically switching the phase of an input signal in accordance with a predetermined repetition rate as established by a given switching signal. In particular, the invention relates to circuit switches which may be used for switching the phase of the chrominance signal in a PAL type television system.

SUMMARY OF THE INVENTION

It is an important feature of the present invention to provide an improved phase switching circuit.

It is another feature of the present invention to provide an improved phase switching circuit utilizing a novel four terminal semiconductor device having a generally V shaped emitter grounded current amplification characteristic.

It is a principal object of the present invention to provide a phase switching circuit of the type described above wherein a constant bias and a rectangular time varying signal are applied between the gate and emitter of a four terminal device as described above to produce a variation in the emitter grounded current amplification factor from a low point to high points located at either side of the low point.

These and other objects, features and advantages of the present invention will be understood in greater detail from the following description and the associated drawings wherein reference numerals are utilized to designate a preferred embodiment.

BRIEF DESCRIPTION OF THE DRAWINGS

FIG. 6 shows a schematic of a phase switching circuit according to the present invention illustrating the presence of a time varying rectangular signal in the gate circuit for producing the desired phase switching action about the low point of the emitter grounded current amplification characteristic curve.

FIG. 7 shows the characteristic curve as mentioned above together with the positioning of the time varying rectangular signal and the superimposed high frequency sinusoidal signal and to the left thereof shows the resulting sinusoidal signal which is phase shifted in accordance with the frequency of the rectangular wave form.

FIG. 8 shows an alternative embodiment of the present invention with the rectangular wave form being applied both to the emitter and to the base circuits to provide a constant base to emitter voltage while providing the desired time varying gate to emitter voltage.

DESCRIPTION OF THE PREFERRED EMBODIMENT

Figure 1:
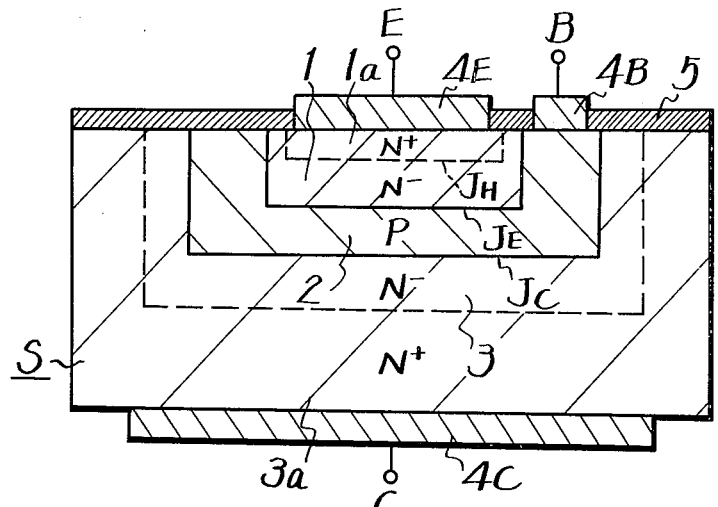
FIGS. 1 and 2 show detailed representations of a three terminal semiconductor device which forms the basis for the four terminal device of the present invention.
Figure 2:
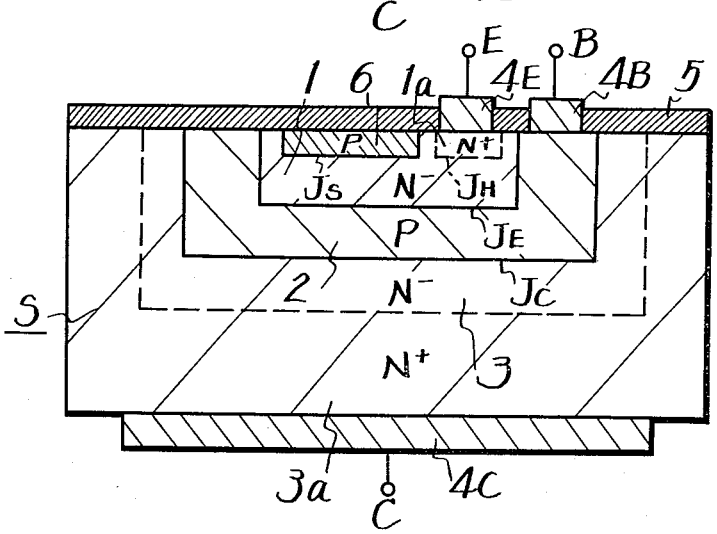
Figure 3:
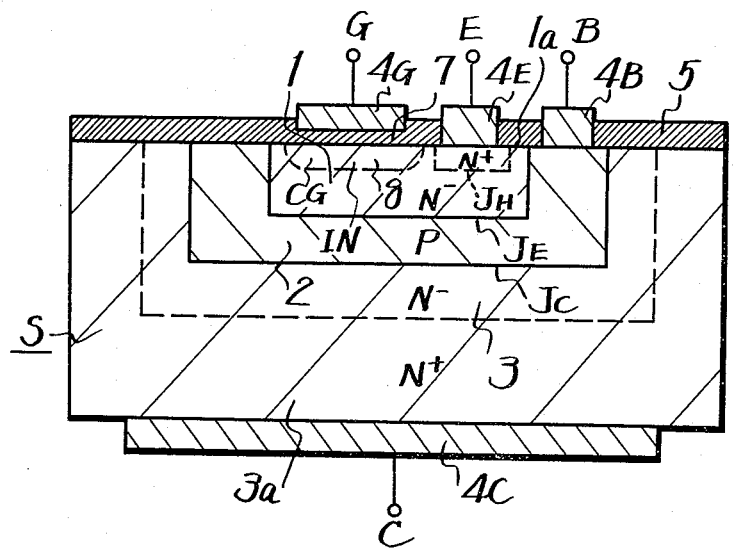
FIG. 3 shows a similar illustration of a four terminal device according to the present invention.

The semiconductor devices of FIGS. 1, 2 and 3 are high in current amplification factor, good in saturation characteristic and low in noise as compared with a prior art bipolar transistor and are constituted by providing a fourth electrode additionally to a body of a novel semiconductor device of the three-terminal type described below.

Before describing the present invention, an embodiment of the novel semiconductor device of the three-terminal type or bipolar transistor will be now described.

The emitter-grounded current amplification factor $h_{FE}$ of a transistor, which is one of the parameters evaluating the characteristics of the bipolar transistor, can be expressed by the following equation (1), if the base-grounded current amplification factor of the transistor is taken as $$h_{FE} = \frac{\alpha}{1-\alpha} \qquad (1)$$

The factor is expressed as follows:

$$\alpha = \alpha^* \beta \gamma \qquad (2)$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \qquad (3)$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \qquad (4)$$

$$J_p = \frac{qD_p p_n}{L_p} \left\{ \exp\left(\frac{qV}{kT}\right) - 1 \right\} \qquad (5)$$

the ratio $\delta J_n$ and $J_p$ is expressed as follows:

$$\delta = \frac{J_p}{J_n} = \frac{L_n D_p}{L_p D_n} \cdot \frac{p_n}{n_p} \qquad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; $V$ a voltage applied to the emitter junction of the transistor; $k$ the Boltzmann's constant; $T$ temperature and $q$ the absolute value of electron charge.

If it is assumed that the impurity concentration in the emitter of the transistor is taken as $N_D$ and that in the base of the transistor taken as $N_A$, the term $$\frac{p_n}{n_p}$$

can be replaced by the term $$\frac{N_A}{N_D}$$

Further, since $L_n$ is restricted by the base width $W$ and $L_n = W$, the ratio $\delta$ is expressed as follows:

$$\delta = \frac{W}{L_p} \cdot \frac{D_p}{D_n} \cdot \frac{N_A}{N_D} \qquad (7)$$

The diffusion constants $D_n$ and $D_p$ are functions of transfer of the carrier and temperature and in this case they are assumed constant substantially.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \qquad (8)$$

the diffusion distance $L_p$ of the minority carriers or holes becomes short. Therefore, as may be apparent from the equation (7), $\tau$ cannot be made small so much and hence the injection efficiency $\gamma$ cannot be made high over a certain value. As a result, the current amplification factor $h_{FE}$ can not be made high so much in the ordinary transistor.

The novel three-terminal semiconductor device is free from the defects mentioned just above inherent to the prior art transistor. As the semiconductor device used in this invention, an NPN-type one and a PNP-type one could be considered as in the case of the prior art transistor, but an NPN-type semiconductor device will be now described with reference to FIGS. 1 and 2, by way of example.

As shown in FIG. 1, the NPN-type three-terminal seimiconductor device consists of a first semiconductor region 1 of N$^-$ type conductivity formed in a semiconductor substrate $\underline{S}$ of N$_+$ type conductivity, a second semiconductor region 2 of P type conductivity formed in the semiconductor substrate $\underline{S}$ adjacent the first region 1, and a third semiconductor region 3 of N$^-$ type conductivity formed in the substrate $\underline{S}$ adjacent the second region 2 to form a first PN-junction J$_E$ between the first and second regions 1 and 2 and a second PN-junction J$_c$ between the second and third regions 2 and 3, respectively.

With the semiconductor device shown in FIG. 1, at the position facing the first junction J$_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected low sufficiently such as in the order of $10^{15}$ atmos/cm$^3$ and region 1a of N$^+$ conductivity or the impurity concentration of about $10^{19}$ atom/cm$^3$ is formed in the first region 1 to form an LH-junction and hence to form the barrier.

The impurity concentration in the second region 2 is selected in the order of $10^{15} - 10^{17}$ atom/cm$^3$ and that in the third region 3 is selected sufficiently low such as in the order of $10^{15}$ atom/cm$^3$.

In the semiconductor substrate $\underline{S}$ adjacent to the third region 3 but apart from the second junction J$_c$, there is formed a region 3a of N$^+$ type conductivity and with the impurity concentration of about $10^{19}$ atom/cm$^3$.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, SiO$_2$ and formed on the surface of the substrate $\underline{S}$.

The semiconductor device shown in FIG. 1 can be used as a transistor. In such a case, the first region 1 serves as an emitter region; the second region 2 as a base region; and the third region 3 as a collector region, respectively, a forward bias is applied to the emitter junction J$_E$ and a reverse bias is applied to the collector junction J$_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate $\underline{S}$ and may be recombined with electrons on the surface in practice, the diffusion distance $L_p$ could not be made long substantially. With the semiconductor device shown in FIG. 1, since the potential barrier is formed in the emitter region 1, which potential barrier faces the emitter junction J$_E$, at the position with a distance smaller than the diffusion distance $L_p$ of the minority carrier, the amount of the surface-recombination is reduced and the diffusion distance $L_p$ can be taken long sufficiently.

Due to the fact that the potential barrier is formed as described above in the example shown in FIG. 1, there is performed such an effect that the current density or component J$_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as $kT$ but the above level difference is desired to be more than 0.1 eV. Within the transition region of the potential, the diffusion distance $L_p$ of the holes must be not terminated within the transition region, or it is required that the diffusion distance $L_p$ of the hole must be greater than the width of the transition region.

In the case that LH-junction $J_H$ is formed as shown in FIG. 1, the potential barrier of 0.2 eV can be formed by suitably selecting the amount of impurity and gradient of the high impurity concentration region $1a$.

FIG. 2 shows another example of the three-terminal semiconductor device in which reference numerals and letters the same as those used in FIG. 1 indicate the same element so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

If, in the semiconductor devices described above, a fourth region or control region is formed in the first region 1 thereof and a fourth electrode or control electrode (gate) is connected thereto so as to form a novel four-terminal semiconductor device, its current amplification factor may be varied by applying a control voltage to the control electrode (gate).

A description will now be given of the novel four-terminal semiconductor device which is suitable for use in the invention with reference to FIG. 3 in which a control electrode (gate) is formed on a surface of a part (semiconductor control region) of the first semiconductor region 1 (emitter region) of the semiconductor device of the three-terminal type shown in FIG. 1 through an insulating layer. Therefore, in FIG. 3, elements corresponding to those of FIG. 1 are shown by the same reference numerals and letters and their description will be omitted for the sake of brevity.

In the embodiment of FIG. 3, a control electrode 4G such as a metal layer made of, for example, aluminum and having a predetermined area is formed on a part of the first semiconductor region (emitter region) 1 of the device shown in FIG. 1 through an insulating layer (gate insulating layer) 7 which has a predetermined thickness, for example, 100 A. (angstrom), and is made of, for example, $SiO_2$ similar to the insulating layer 5, and corresponds to the gate insulating layer of a MOS FET. A gate terminal G is led out from the control electrode 4G as a fourth terminal. A part 8 in the first region 1 opposing the control electrode 4G is the semiconductor control region.

If a gate bias voltage is applied between the gate and emitter of the four-terminal semiconductor device or the gate terminal G and the emitter terminal E, the current amplification factor or emitter-grounded current amplification factor $h_{FE}$ thereof is varied in response to the gate bias voltage along a curve which is convex in the downward direction and substantially symmetrical with respect to its minimum value. In other words, if a bias voltage which is negative relative to the emitter terminal E in the device of FIG. 3, within the positive range from the threshold voltage of the bias voltage, a storage layer CG having the function similar to the LH-junction $J_H$ as the potential barrier in FIG. 1 is formed in a part of the first region (emitter region) 1 as the voltage approaches the positive direction. Thus, the current density $J_P$ of the holes of the diffusion current from the second region (base region) 2 to the first region (emitter region) 1 decreases, and consequently the factor $h_{FE}$ increases.

While, within the negative region from the threshold voltage of the bias voltage, an inverse layer IN is formed in a part of the emitter region 1 or control region 8 as the voltage approaches the negative direction and, similar to the case where the additional region 6 in FIG. 2 is floated in electrical point of view, holes are re-injected from the inverse layer IN to the emitter region 1. Thus, the current density $J_P$ of the holes of the diffusion current from the base region 2 to the emitter region 1 decreases, and consequently the factor $h_{FE}$ increases.

Figure 4:
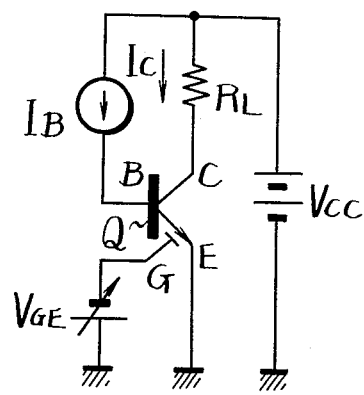
FIG. 4 shows a test circuit for developing an emitter grounded current amplification characteristic as illustrated in FIG. 5.
Figure 5:
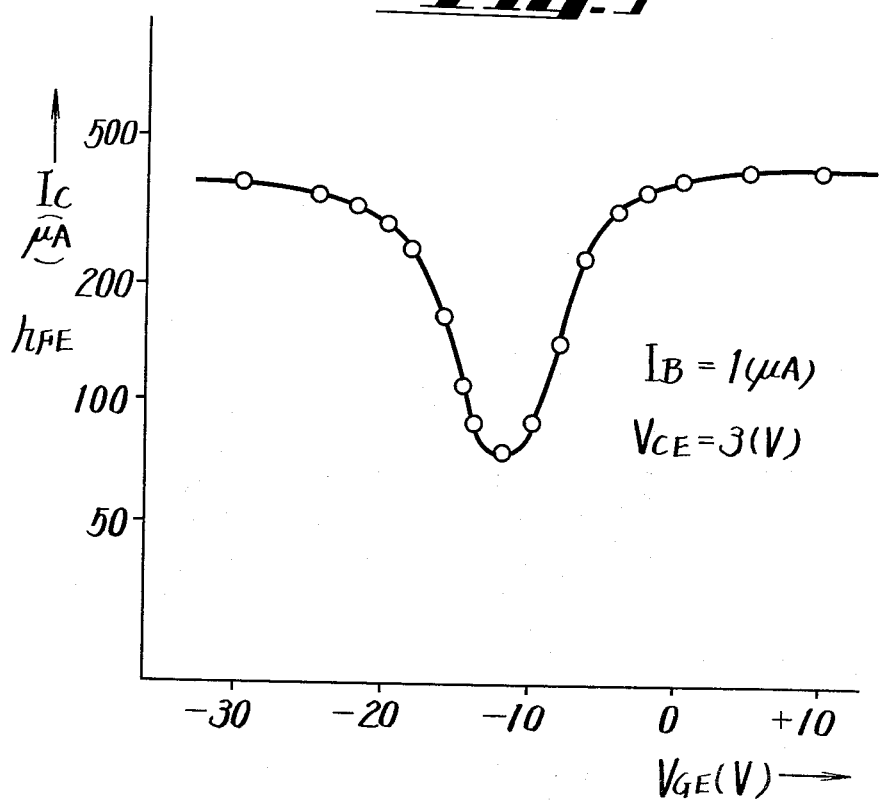
FIG. 5 shows the emitter grounded current amplification characteristic curve which is derived from the circuit of FIG. 4.

FIG. 5 is a graph showing the characteristics of the novel four-terminal semiconductor device shown in FIG. 3 which is measured by a measuring circuit shown in FIG. 4.

In FIG. 4, reference letter Q indicates the novel four-terminal semiconductor device shown in FIG. 3 as a symbol, in which a short line is added to the symbol of the prior art bipolar transistor in parallel to its emitter as the gate of the novel four-terminal semiconductor device Q. In FIG. 4, the novel four-terminal semiconductor device Q is shown as an emitter-grounded type. In the figure, reference letter $R_L$ indicates a collector load resistor of the device Q, $V_{CC}$ its collector voltage source, $I_C$ its collector current, $I_B$ its base current (constant), and $V_{GE}$ its gate-emitter voltage, respectively.

When its collector-emitter voltage $V_{CE}$ is 3V (volts) and the base current $I_B$ is 1 μA (micro-ampere), the characteristics of the gate-emitter voltage (gate bias voltage) $V_{GE}(V)$ - collector current $I_C$ (μA) and emitter-grounded current amplification factor $h_{FE}$ are shown in the graph of FIG. 5.

According to the characteristic curve of FIG. 5, it may be understood that the current amplification factor $h_{FE}$ is varied in response to the variation of the gate bias voltage along a curve which is convex in the downward direction and approximately symmetrical with respect to its minimum value (where the gate-emitter voltage is at the above threshold voltage).

When the thickness of the emitter region 1 of the semiconductor device shown in FIG. 3 is selected smaller than the diffusion distance $L_p$ of the holes (injected carriers), the surface recombination, where the gate-emitter voltage $V_{GE}$ is substantially equal to the threshold voltage, influences much. Thus, the life time period of the injected carrier (minority carrier) becomes short, and accordingly the minimum value of the factor $h_{FE}$ can be made small further.

The embodiment shown in FIG. 3 is an NPN type element, but it may be, of course, possible that the semiconductor device is made as a PNP type one as in the case of a bipolar transistor.

Referring to FIG. 6, the semiconductor device of the type shown in FIG. 3 is illustrated by Q. This device has first, second, third and fourth terminals respectively with the first terminal being grounded as shown, the second terminal being the base which is connected between two resistors 32 and 33, the third terminal is connected to an output at $e_0$ and through a resistor 34 to a main power supply at a circuit point 31. The fourth terminal is the gate and it is connected to three signal sources. The first is referred to as the input signal $e_1$ identified by the numeral 31. The second is a rectangular switching signal identified as $E_s$ or by the numeral 36 and the third is a constant bias signal identified by the numeral 39.

Referring to FIG. 7, the emitter grounded current amplification factor is illustrated as being a generally V-shaped curve. The various signal wave forms produced by the sources 36, 37 and 39 are shown below the characteristic curve. The constant bias source 39 biases the gate to a circuit point identified by a vertical dashed line which intersects the low point of the characteristic curve. The rectangular switching signal then fluctuates about this low point causing the emitter grounded current amplification factor to rise at both sides of the low point. A relatively high frequency signal is then superimposed on the low frequency rectangular signal as shown. It is the high frequency signal which has its phase desired to be shifted with each half cycle of the low frequency rectangular wave form. The resulting phase shifted signal is shown to the left and identified as $e_0$.

To the right of the figure each half cycle of the rectangular wave form is identified by the designation $H_n$, $H_{n+1}$, $H_{n+2}$, $H_{n+3}$. These may represent one horizontal sweep of a cathode ray in a television receiver.

In time period $H_n$, it can be seen that as input signal $e_1$ increases, the emitter grounded current amplification factor increases resulting in an increase in collector current and a decrease in the output signal $e_0$. At the initiation of the subsequent time period, $H_{n+1}$, a decrease in the signal $e_1$ results in an increase in the emitter grounded current amplification factor, resulting in an increase in collector current, and a corresponding decrease in output signal $e_0$. The result is that the phase has been shifted from the initial time period $H_n$ to the next subsequent time period $H_{n+1}$. This process continues indefinitely with a 180° phase shift each succeeding time period.

In FIG. 8, the rectangular signal is applied not to the gate circuit but to the emitter circuit. Since it is necessary to have a constant base to emitter voltage, a similar rectangular wave form is also applied at the base circuit. These signals are identified as $E_s$, $E_D$ respectively. The result is the same as the illustration in FIG. 7 because the resulting gate to emitter variations are the same in this arrangement. In this case, the signal $E_s$ is identified by the numeral 40 and a constant voltage source identified by $V_T$ and also by the numeral 41. The source $E_D$ is identified by the numeral 42, and the constant bias source for the base is identified by the numeral 43 and is equivalent to $V_T + V_{BE}$.

Accordingly it can be seen that the same output signal results either by application of the three signal sources in the gate circuit or by utilizing the rectangular switching signal in the emitter circuit as well as a compensating signal in the base circuit.

I claim as my invention:
1. A phase switching device comprising:
   a semiconductor device having a first semiconductor region of one conductivity type,
   a second semiconductor region of the opposite conductivity type adjacent said first region with a first semiconductor junction therebetween,
   a third semiconductor region of the same conductivity type of said first region adjacent said second region with a second semiconductor junction therebetween, first, second and third terminals coupled to said first, second and third regions, respectively;
   a fourth terminal connected to said semiconductor device and having at least a portion thereof located adjacent to said first region at a position which is spaced from the said first terminal, and an insulating layer separating said fourth terminal from said first region,
   means for applying a low frequency switching signal between said first and fourth terminals,
   means for superimposing a high frequency signal onto said low frequency signal,
   said semiconductor device having an emitter grounded amplification characteristic which has a relatively low point with steeply increasing segments extending substantially symmetrically therefrom at both sides thereof in response to linear changes in voltage between said first and fourth terminals.
   bias means for establishing the dc voltage between said first and fourth terminals to be of such a value as to cause said device to operate at said relatively low point of said emitter grounded amplification characteristic, and
   means for biasing said device into a continuously conducting state.
2. A device in accordance with claim 1 wherein said low frequency switching signal is a substantial rectilinear waveform.
3. A device in accordance with claim 1 wherein said low frequency signal means is in series with said high frequency signal means and both are coupled in series with said fourth terminal.

4. A device in accordance with claim 1 wherein said low frequency signal means is in series with said first terminal and an additional low frequency signal means is coupled in series with said second terminal, said additional signal being of similar configuration to said first-mentioned low frequency signal to establish a relatively constant voltage difference between said first and second terminals.

5. A device in accordance with claim 1 wherein said low frequency switching signal is of such amplitude as to cause the operating value of said emitter grounded amplification characteristic to lie substantially in the mid range of said steeply increasing segments.

6. A device in accordance with claim 1, wherein said first and third regions of the semiconductor device each have at least a first portion with concentrations of substantially the same order of magnitude and said first region being provided with a second portion having an impurity concentration higher than said first portion of the first region at a position spaced from said first junction by a distance which is smaller than the diffusion distance of the minority carriers.

* * * * *